(12) United States Patent
Sato et al.

(10) Patent No.: US 9,355,861 B2
(45) Date of Patent: May 31, 2016

(54) SEMICONDUCTOR DEVICE MANUFACTURING METHOD AND COMPUTER-READABLE STORAGE MEDIUM

(71) Applicant: TOKYO ELECTRON LIMITED, Tokyo (JP)

(72) Inventors: Manabu Sato, Miyagi (JP); Kazuki Narishige, Miyagi (JP); Takanori Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/375,182

(22) PCT Filed: Feb. 26, 2013

(86) PCT No.: PCT/JP2013/001133
§ 371 (c)(1),
(2) Date: Jul. 29, 2014

(87) PCT Pub. No.: WO2013/128900
PCT Pub. Date: Sep. 6, 2013

(65) Prior Publication Data
US 2015/0056816 A1    Feb. 26, 2015

Related U.S. Application Data

(60) Provisional application No. 61/608,204, filed on Mar. 8, 2012.

(30) Foreign Application Priority Data

Mar. 2, 2012   (JP) .................................. 2012-046487

(51) Int. Cl.
*H01L 21/311*    (2006.01)
*H01L 21/027*    (2006.01)
(Continued)

(52) U.S. Cl.
CPC ...... *H01L 21/31116* (2013.01); *H01J 37/32091* (2013.01); *H01L 21/0273* (2013.01); *H01L 21/3065* (2013.01); *H01L 21/31138* (2013.01); *H01L 21/31144* (2013.01)

(58) Field of Classification Search
CPC .................... H01L 27/11578; H01L 29/7926; H01L 27/11582
See application file for complete search history.

(56) References Cited

U.S. PATENT DOCUMENTS 6,894,932 B1 *   5/2005   Melik-Martirosian et al. .................. 365/185.28
8,563,231 B2 * 10/2013   Wang et al. ................... 430/331

(Continued)

FOREIGN PATENT DOCUMENTS

JP    2009-170661 A    7/2009
JP    2009-267352 A    11/2009
(Continued)

OTHER PUBLICATIONS

International Search Report mailed May 28, 2013 in PCT/JP2013/001133.

*Primary Examiner* — Duy Deo
(74) *Attorney, Agent, or Firm* — Rothwell, Figg, Ernst & Manbeck, P.C.

(57) ABSTRACT

A semiconductor device manufacturing method for etching a substrate having a multilayer film formed by alternately stacking a first film and a second film, and a photoresist layer to form a step-shaped structure is provided. The step-shaped structure is formed by repeatedly performing a first step of plasma-etching the first film by using the photoresist layer as a mask, a second step of exposing the photoresist layer formed on the substrate to a plasma generated from a processing gas containing argon gas and hydrogen gas by applying a high frequency power to a lower electrode while applying a negative DC voltage to an upper electrode, a third step of trimming the photoresist layer, and a fourth step of plasma-etching the second film.

8 Claims, 9 Drawing Sheets

(51) Int. Cl.
*H01J 37/32* (2006.01)
*H01L 21/3065* (2006.01)

(56) References Cited

U.S. PATENT DOCUMENTS

2009/0275207 A1 11/2009 Honda et al.
2010/0055911 A1 3/2010 Fujihara
2011/0059616 A1* 3/2011 Narishige et al. ............. 438/711
2011/0201167 A1 8/2011 Satonaka et al.

FOREIGN PATENT DOCUMENTS

JP 2010-62363 A 3/2010
JP 2011-60916 A 3/2011
JP 2011-166061 A 8/2011

* cited by examiner

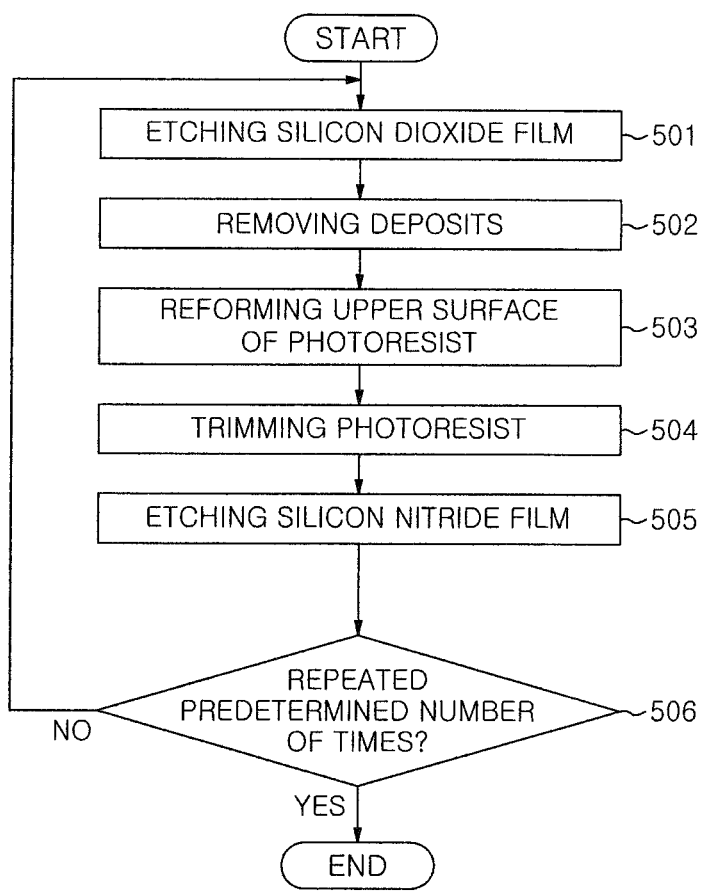

SEMICONDUCTOR DEVICE MANUFACTURING METHOD AND COMPUTER-READABLE STORAGE MEDIUM

CROSS REFERENCE TO RELATED APPLICATIONS

This application is a 35 U.S.C. 371 National Phase Entry Application from PCT/JP2013/001133, filed Feb. 26, 2013, which claims priority to and the benefit of U.S. Provisional Application No. 61/608,204, filed Mar. 8, 2012 and Japanese Patent Application No. 2012-046487, filed Mar. 2, 2012, the benefit of priority is claimed to each of the foregoing, and the entire contents of each of the foregoing are incorporated herein by reference.

FIELD OF THE INVENTION

The present invention relates to a method for manufacturing a semiconductor device and a computer-readable storage medium.

BACKGROUND OF THE INVENTION

Conventionally, in a manufacturing process of a semiconductor device, plasma processing is carried out to perform etching or deposition on a substrate such as a semiconductor wafer by the action of a plasma. In the manufacturing process of the semiconductor device, for example, in the manufacturing process of a NAND flash memory, it is known that plasma etching and trimming of a mask are performed on a multilayer film formed by alternately stacking two types of films having different dielectric constants, e.g., an insulating film and a conductive film to form a step-shaped structure (see, e.g., Patent Document 1).

RELATED ART DOCUMENTS

Patent Document (Patent Document 1) Japanese Patent Application Publication No. 2009-170661

In the manufacturing process of a semiconductor device for forming the step-shaped structure of the multilayer film formed by alternately stacking two types of films having different dielectric constants, e.g., an insulating film and a conductive film, there is a problem in that the manufacturing efficiency deteriorates due to the increased number of steps, and it is difficult to form a step-shaped multilayer structure in a desirable shape due to an influence of deposits or the like.

SUMMARY OF THE INVENTION

In view of the above, the present invention provides a method for manufacturing a semiconductor device and a computer-readable storage medium capable of efficiently forming a step-shaped multilayer structure in a desirable shape.

In accordance with an aspect of the present invention, there is provided a semiconductor device manufacturing method for etching a substrate having a multilayer film formed by alternately stacking a first film having a first dielectric constant and a second film having a second dielectric constant different from the first dielectric constant, and further having a photoresist layer provided on the multilayer film and functioning as an etching mask to form a step-shaped structure, the method including a first step of plasma-etching the first film by using the photoresist layer as a mask, a second step of exposing the photoresist layer formed on the substrate to a plasma by using a plasma processing apparatus which includes an upper electrode having at least a silicon member and further includes a lower electrode which is disposed opposite to the upper electrode and for mounting thereon the substrate, the plasma being generated from a processing gas containing argon gas and hydrogen gas by applying a high frequency power to the lower electrode while applying a negative DC voltage to the upper electrode, a third step of trimming the photoresist layer after the second step, and a fourth step of plasma-etching the second film by using the photoresist layer trimmed in the third step and the first film plasma-etched in the first step as an etching mask, wherein the multilayer film is formed to have a step-shaped structure by repeatedly performing the first step to the fourth step.

In accordance with another aspect of the present invention, there is provided a semiconductor device manufacturing method for plasma-etching a film below a photoresist layer formed on a substrate by using the photoresist layer as a mask, the method including a photoresist reforming step of exposing the photoresist layer to a plasma by using a plasma processing apparatus which includes an upper electrode having at least a silicon member and further includes a lower electrode which is disposed opposite to the upper electrode and for mounting thereon the substrate, the plasma being generated from a processing gas containing argon gas and hydrogen gas by applying a high frequency power to the lower electrode while applying a negative DC voltage to the upper electrode, and a trimming step of trimming the photoresist layer after the photoresist reforming step, wherein in the trimming step, a ratio of a trimming amount in a height direction of the photoresist layer to a trimming amount in a horizontal direction is equal to or less than 0.7.

Effects of the Invention

With the present invention, it is possible to provide the semiconductor device manufacturing method and the computer-readable storage medium capable of efficiently forming a step-shaped multilayer structure in a desirable shape.

BRIEF DESCRIPTION OF THE DRAWINGS

FIG. 5 is a flowchart showing the steps of another embodiment of the present invention.

DETAILED DESCRIPTION OF THE EMBODIMENTS

Hereinafter, embodiments of the present invention will be described in detail with reference to the accompanying drawings.

Figure 1:
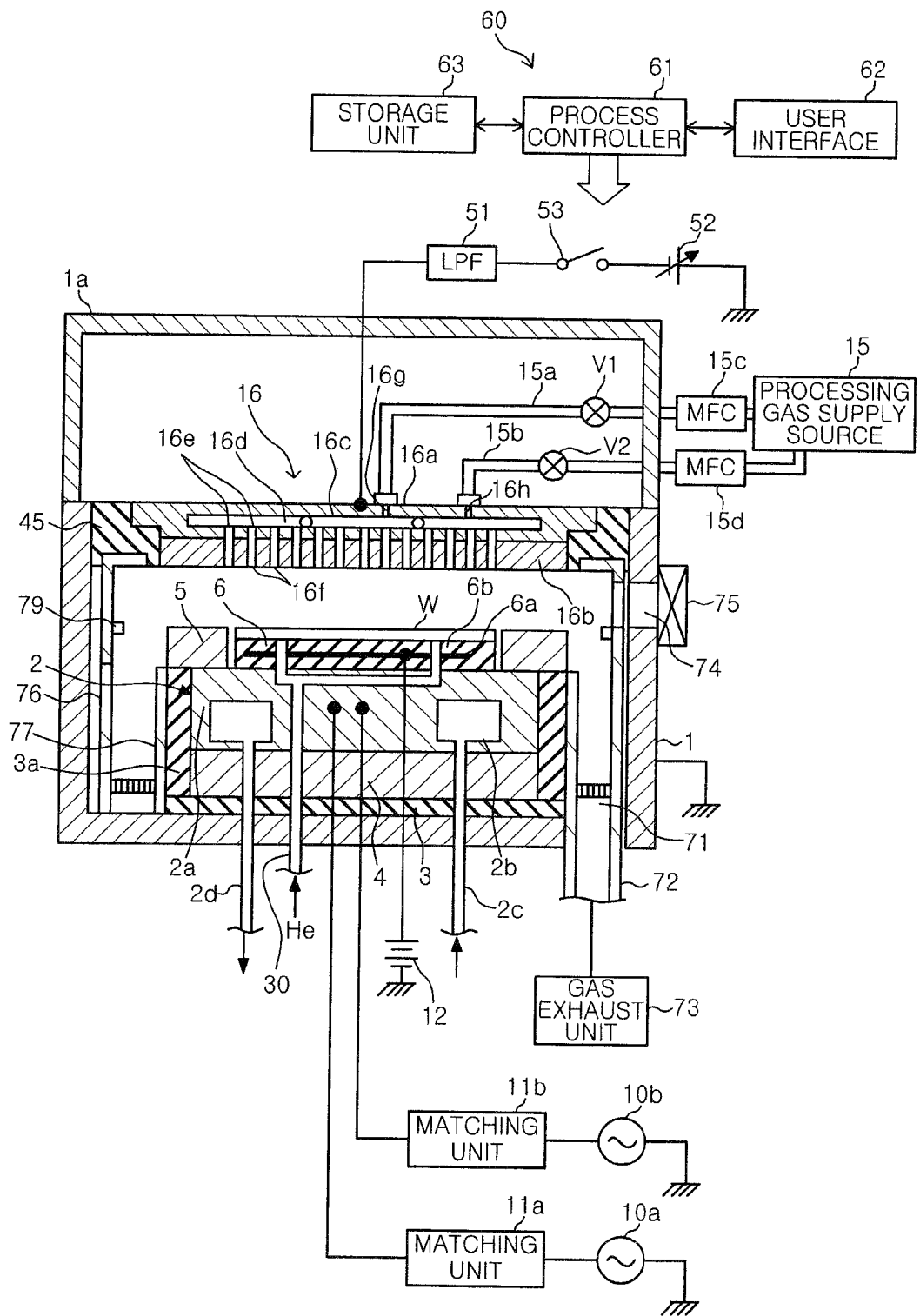
FIG. 1 shows a schematic configuration of a plasma processing apparatus used in an embodiment of the present invention.

FIG. 1 shows a configuration of a plasma processing apparatus used in a method for manufacturing a semiconductor device according to the embodiments. First, a configuration of the plasma processing apparatus will be described.

The plasma processing apparatus includes a processing chamber 1 which is airtightly sealed and electrically grounded. The processing chamber 1 has a cylindrical shape and is made of, e.g., aluminum whose surface is anodically oxidized. In the processing chamber 1, a mounting table 2 is provided to horizontally support a semiconductor wafer W serving as a substrate to be processed.

The mounting table 2 includes a base 2a made of a conductive metal such as aluminum, and functions as a lower electrode. The mounting table 2 is supported by a conductive support 4 through an insulating plate 3. Further, a focus ring 5 made of, e.g., single crystalline silicon is provided at an upper periphery of the mounting table 2. Further, a cylindrical inner wall member 3a made of, e.g., quartz is provided to surround the mounting table 2 and the support 4.

The base 2a of the mounting table 2 is connected to a first high frequency power supply 10a via a first matching unit 11a and also connected to a second high frequency power supply 10b via a second matching unit 11b. The first high frequency power supply 10a is used for plasma generation, and supplies a high frequency power of a predetermined frequency (e.g., 60 MHz) to the base 2a of the mounting table 2. Further, the second high frequency power supply 10b is used for ion attraction (bias) and supplies a high frequency power of a predetermined frequency (e.g., 400 kHz) lower than that of the first high frequency power supply 10a to the base 2a of the mounting table 2. Meanwhile, a shower head 16 functioning as an upper electrode is provided above the mounting table 2 to be opposite to the mounting table 2 in parallel. The mounting table 2 and the shower head 16 serve as a pair of electrodes (the upper and the lower electrode).

An electrostatic chuck 6 for electrostatically attracting and holding the semiconductor wafer W is provided on the upper surface of the mounting table 2. The electrostatic chuck 6 includes an electrode 6a embedded in an insulator 6b, and the electrode 6a is connected to a DC power supply 12. The semiconductor wafer W is attracted and held on the electrostatic chuck 6 by a Coulomb force when a DC voltage is applied from the DC power supply 12 to the electrode 6a.

A coolant path 2b is formed in the mounting table 2, and a coolant inlet pipe 2c and a coolant outlet pipe 2d are connected to the coolant path 2b. Then, by circulating a coolant such as Galden in the coolant path 2b, the support 4 and the mounting table 2 can be controlled to a predetermined temperature. Further, a backside gas supply pipe 30 for supplying a cold heat transfer gas (backside gas) such as helium gas to the backside of the semiconductor wafer W is provided to pass through the mounting table 2 and the like. The backside gas supply pipe 30 is connected to a backside gas supply source (not shown). With this configuration, the semiconductor wafer W, which is attracted and held on the upper surface of the mounting table 2 by the electrostatic chuck 6, can be controlled to a specified temperature.

The shower head 16 described above is provided at the top wall of the processing chamber 1. The shower head 16 includes a main body 16a and a ceiling plate 16b serving as an electrode plate. The shower head 16 is supported at a top portion of the processing chamber 1 through an insulating member 45. The main body 16a is made of a conductive material such as anodically oxidized aluminum and is configured to detachably hold the ceiling plate 16b made of silicon thereunder.

Gas diffusion spaces 16c and 16d are formed inside the main body 16a. Gas holes 16e are formed in a bottom portion of the main body 16a to be located under the gas diffusion spaces 16c and 16d. The gas diffusion space is divided into two parts, i.e., the gas diffusion space 16c provided in a central portion and the gas diffusion space 16d provided in a peripheral portion. Accordingly, the supply state of processing gas can be controlled independently in the central portion and the peripheral portion.

Further, gas injection holes 16f are provided in the ceiling plate 16b to extend through the ceiling plate 16b in a thickness direction thereof and communicate with the respective gas holes 16e. With this configuration, the processing gas supplied to the gas diffusion spaces 16c and 16d is supplied in a shower form into the processing chamber 1 through the gas holes 16e and the gas injection holes 16f. A channel (not shown) for circulating a coolant is provided in the main body 16a and the like to control the shower head 16 to a desired temperature during a plasma etching process.

Two gas inlet ports 16g and 16h for introducing a processing gas into the gas diffusion spaces 16c and 16d are formed in the main body 16a. The gas inlet ports 16g and 16h are respectively connected to one ends of gas supply lines 15a and 15b. The other ends of the gas supply lines 15a and 15b are connected to a processing gas supply source 15 for supplying a processing gas for etching. Further, the gas supply line 15a is provided with a mass flow controller (MFC) 15c and a valve V1 in sequence from the upstream side. Further, the gas supply line 15b is provided with a mass flow controller (MFC) 15d and a valve V2 in sequence from the upstream side.

Further, a processing gas for plasma etching is supplied to the gas diffusion spaces 16c and 16d from the processing gas supply source 15 through the gas supply lines 15a and 15b. The processing gas is supplied in a shower form into the processing chamber 1 from the gas diffusion spaces 16c and 16d through the gas holes 16e and the gas injection holes 16f.

A variable DC power supply 52 is electrically connected to the shower head 16 serving as the upper electrode through a low pass filter (LPF) 51. The power supply of the variable DC power supply 52 is turned on and off by a switch 53. Current and voltage of the variable DC power supply 52 and turn-on and turn-off operation of the switch 53 are controlled by a control unit 60 which will be described later. As will be described later, when a plasma is generated in a processing space by applying high frequency powers to the mounting table 2 from the first high frequency power supply 10a and the second high frequency power supply 10b, the switch 53 is turned on by the control unit 60 if necessary, and a predetermined DC voltage is applied to the shower head 16 serving as the upper electrode.

A cylindrical ground conductor 1a is extended upward from the sidewall of the processing chamber 1 to be located at a position higher than the shower head 16. The cylindrical ground conductor 1a has a ceiling wall at the top thereof.

A gas exhaust port 71 is formed at the bottom of the processing chamber 1. The gas exhaust port 71 is connected to a gas exhaust unit 73 through a gas exhaust pipe 72. The gas exhaust unit 73 has a vacuum pump, and the processing chamber 1 can be evacuated to a predetermined vacuum level by operating the vacuum pump. Meanwhile, a loading and unloading port 74 for the semiconductor wafer W is provided at the sidewall of the processing chamber 1, and a gate valve 75 for opening and closing the loading and unloading port 74 is provided at the loading and unloading port 74.

Reference numerals 76 and 77 of FIG. 1 denote detachable deposition shields. The deposition shield 76 is provided along the inner wall surface of the processing chamber 1 to prevent etching by-products (deposits) from being adhered to the processing chamber 1. A conductive member (GND block)

79, which is DC-connected to the ground, is located at the substantially same height as the semiconductor wafer W on the deposition shield 76, thereby preventing abnormal discharge.

The overall operation of the plasma processing apparatus configured as described above is controlled by the control unit 60. The control unit 60 includes a process controller 61 having a CPU to control each part of the plasma processing apparatus, a user interface 62 and a storage unit 63.

The user interface 62 includes a keyboard through which a process manager inputs a command to manage the plasma processing apparatus, a display for visually displaying an operational status of the plasma processing apparatus, and so forth.

The storage unit 63 stores therein control programs (software) for implementing various processes in the plasma processing apparatus under the control of the process controller 61, and recipes including processing condition data and the like. In response to instructions from the user interface 62 or the like, if necessary, a certain recipe is retrieved from the storage unit 63 and executed by the process controller 61. Accordingly, a desired process is performed in the plasma processing apparatus under the control of the process controller 61. The control programs and the recipes including the processing condition data may be read out from a computer-readable storage medium (e.g., a hard disk, a CD, a flexible disk, a semiconductor memory, etc.), or may be used online by transmission from another apparatus through, e.g., a dedicated line, whenever necessary.

Next, a sequence for processing the semiconductor wafer W in the plasma processing apparatus having the above-described configuration will be described. First, the gate valve 75 is opened, and the semiconductor wafer W is loaded into the processing chamber 1 through the loading and unloading port 74 through a load-lock chamber (not shown) by a transfer robot (not shown) and mounted on the mounting table 2. Then, the transfer robot is retracted from the processing chamber 1 and the gate valve 75 is closed. Then, the processing chamber 1 is evacuated through the gas exhaust port 71 by using the vacuum pump of the gas exhaust unit 73.

After the inside of the processing chamber 1 reaches a predetermined vacuum level, a specific processing gas (etching gas) is introduced into the processing chamber 1 from the processing gas supply source 15, and the inside of the processing chamber 1 is maintained at a predetermined pressure. At this time, the supply state of the processing gas from the processing gas supply source 15 may be made different between the central portion and the peripheral portion. Further, in the total supply amount of the processing gas, a ratio of the supply amount from the central portion to the supply amount from the peripheral portion may be controlled to a desired value.

In this state, a high frequency power having a frequency of, e.g., 60 MHz is supplied to the base 2a of the mounting table 2 from the first high frequency power supply 10a. Further, a high frequency power (for bias) having a frequency of, e.g., 400 kHz is supplied to the base 2a of the mounting table 2 from the second high frequency power supply 10b to attract ions. At this time, a predetermined DC voltage is applied to the electrode 6a of the electrostatic chuck 6 from the DC power supply 12, and the semiconductor wafer W is attracted to and held on the electrostatic chuck 6 by a Coulomb force.

By applying the high frequency power to the mounting table 2 serving as the lower electrode as described above, an electric field is formed between the shower head 16 serving as the upper electrode and the mounting table 2 serving as the lower electrode. Due to the electric field, an electric discharge is generated in the processing space in which the semiconductor wafer W is located. As a result, a plasma of the processing gas is generated to perform plasma processing (etching process, reforming process of a photoresist film, or the like) on the semiconductor wafer W.

Further, as described above, by applying the DC voltage to the shower head 16 during the plasma process, the following effects can be obtained. Depending on the process, a plasma having high electron density and low ion energy may be required. If the DC voltage is supplied in such a case, energy of ions implanted into the semiconductor wafer W decreases, and electron density of the plasma increases. As a consequence, an etching rate of a target film of the semiconductor wafer W increases, whereas a sputtering rate of a film serving as a mask formed on the etching target film is reduced. As a result, etching selectivity can be improved.

Upon the completion of the plasma process, the supply of high frequency power, the supply of the DC voltage and the supply of the processing gas are stopped, and the semiconductor wafer W is unloaded from the processing chamber 1 in the reverse sequence to the above-described sequence.

Figure 2A:
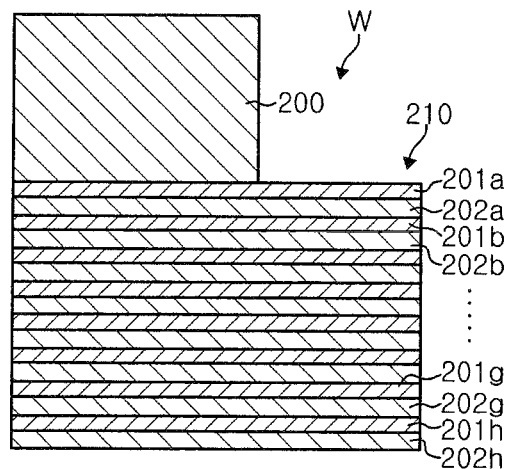
FIGS. 2A to 2E are cross sections showing schematic configuration of a semiconductor wafer according to the embodiment of the present invention.

Next, a method for manufacturing a semiconductor device according to a first embodiment of the present invention will be described with reference to FIGS. 2A to 3. FIGS. 2A to 2E show schematic cross-sectional views of the semiconductor wafer W serving as a target substrate according to the present embodiment, and show the steps of the present embodiment. FIG. 3 is a flowchart showing the steps of the present embodiment.

As shown in FIG. 2A, a photoresist film 200 which is patterned in a predetermined shape and functions as a mask is formed at the top of the semiconductor wafer W. The photoresist film 200 has a thickness of, e.g., about 5 μm. A silicon dioxide ($SiO_2$) film 201a is formed below the photoresist film 200, and a silicon nitride film 202a is formed below the silicon dioxide film 201a.

Further, a silicon dioxide film 201b is formed below the silicon nitride film 202a, and a silicon nitride film 202b is formed below the silicon dioxide film 201b. As such, silicon dioxide films 201 and silicon nitride films 202 are alternately stacked to form a multilayer film 210. The number of stacked layers of the multilayer film 210 is, for example, a total of 64 layers including 32 layers of the silicon dioxide films 201 and 32 layers of the silicon nitride films 202.

Although the present embodiment will be described using a multilayer film formed by stacking the silicon dioxide film and the silicon nitride film as an example, it may be applied to a multilayer film formed by stacking a first film having a first dielectric constant and a second film having a second dielectric constant different from the first dielectric constant. Specifically, for example, it may be applied to a multilayer film formed by stacking a silicon dioxide film and a polysilicon film (doped polysilicon film), a multilayer film formed by stacking a polysilicon film and a doped polysilicon film, or the like.

Figure 2B:
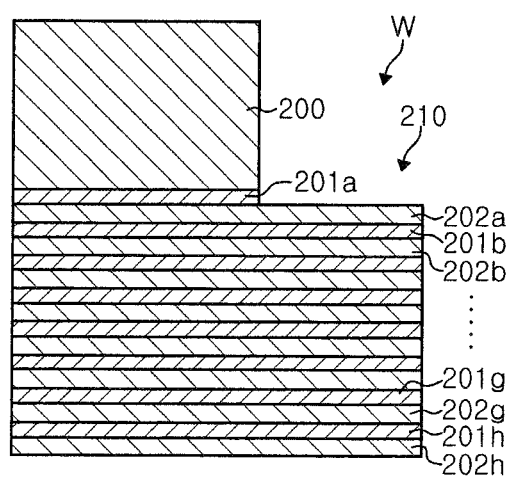
Figure 3:
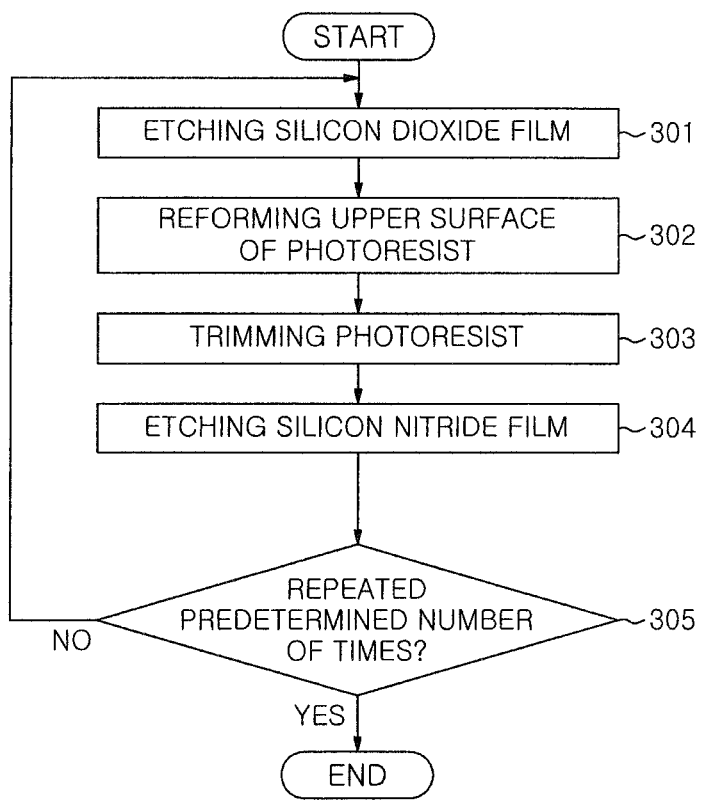
FIG. 3 is a flowchart showing the steps of the embodiment of the present invention.

From a state shown in FIG. 2A, the silicon dioxide film 201a is plasma etched by using the photoresist film 200 as a mask, to obtain the state shown in FIG. 2B (step 301 shown in FIG. 3). The plasma etching process is performed by using a plasma of the processing gas of, e.g., $C_4F_6+Ar+O_2$.

Figure 2C:
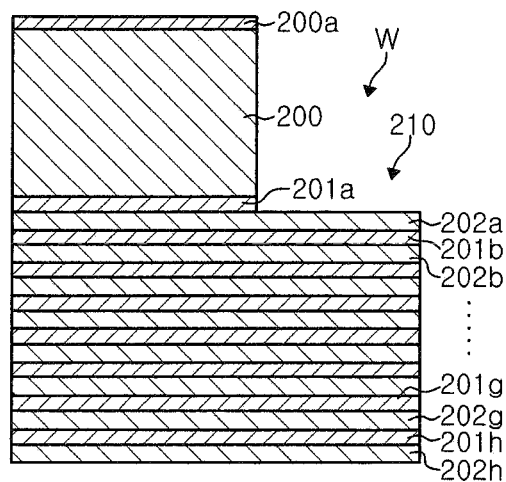
Figure 2D:
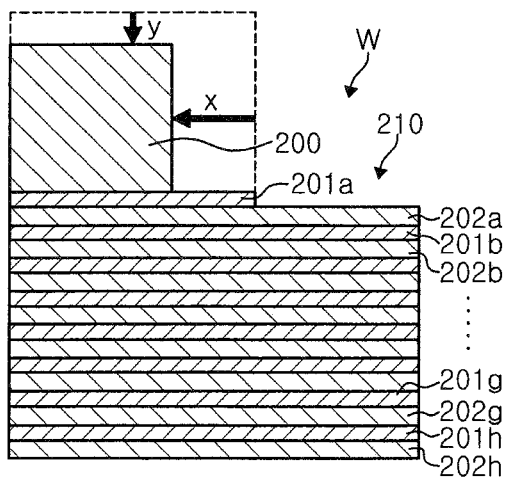

Then, a reforming (curing) process for reforming the upper surface of the photoresist film 200 is performed to form a reformed film 200a on the upper surface of the photoresist film 200, and the state shown in FIG. 2C is obtained (step 302 shown in FIG. 3). The reforming (curing) process is performed by applying a negative DC voltage from the variable DC power supply 52 to the ceiling plate 16b made of silicon as the upper electrode while applying a high frequency power of a predetermined frequency from the first high frequency power supply 10a to the mounting table 2 as the lower electrode and supplying a mixed gas of Ar and H$_2$ as a processing gas to generate a plasma of the mixed gas in the plasma processing apparatus shown in FIG. 1.

In this case, Ar ions in the plasma are accelerated by the negative DC voltage applied to the ceiling plate 16b made of silicon to sputter the ceiling plate 16b and to generate silicon and electrons. The electrons are accelerated by an electric field caused by the negative DC voltage applied to the ceiling plate 16b to collide with and reform the upper surface of the photoresist film 200. Further, the silicon acts to form a coating layer of silicate carbon or the like on the upper surface of the photoresist film 200. Thus, the reforming (curing) process is performed on the upper surface of the photoresist film 200 by silicon and electrons, and the reformed film 200a is formed.

Subsequently, a trimming process of the photoresist film 200 is performed to increase the opening area of the photoresist film 200. In other words, a portion of the silicon dioxide film 201a below the photoresist film 200 is exposed to obtain the state shown in FIG. 2D (step 303 shown in FIG. 3). The trimming process is performed by using a plasma of the processing gas of, e.g., O$_2$.

Figure 2E:
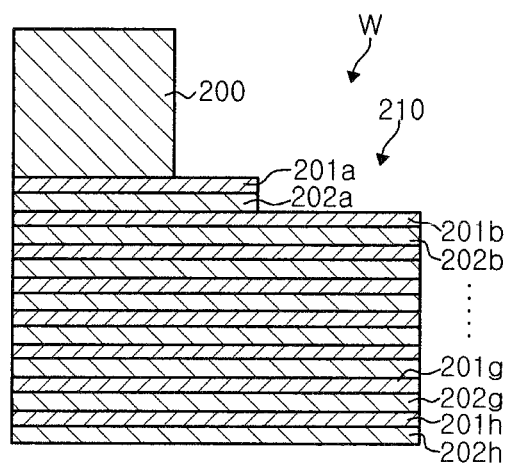

Then, using the photoresist film 200 and the exposed portion of the silicon dioxide film 201a as a mask, the silicon nitride film 202a below the silicon dioxide film 201a is plasma etched to obtain the state shown in FIG. 2E (step 304 shown in FIG. 3). This plasma etching process is performed by using a plasma of the processing gas of, e.g., CH$_2$F$_2$+Ar+O$_2$.

By the above-described steps, a step shape of the first stage is formed. Thereafter, the steps from the plasma etching of the silicon dioxide film 201 to the plasma etching of the silicon nitride film 202 are performed repeatedly a predetermined number of times (step 305 shown in FIG. 3) to form a step-shaped structure having a predetermined number of stages.

As described above, in the present embodiment, since the reforming process of the upper surface of the photoresist film 200 is performed before the trimming process, it is possible to suppress the trimming amount of the upper surface of the photoresist film 200 during the trimming process. Accordingly, in the trimming process, a reduction (y shown in FIG. 2D) in the thickness of the photoresist film 200 is suppressed, and the trimming amount (x shown in FIG. 2D) of the photoresist film 200 in the horizontal direction increases, thereby reducing a trim ratio y/x.

As an example, by using the plasma processing apparatus having the configuration shown in FIG. 1, processing was performed on the multilayer film formed by alternately stacking the silicon dioxide film and the silicon nitride film as shown in FIGS. 2A to 2E under the following process conditions, thereby forming a step-shaped structure.

(Etching of the Silicon Dioxide Film)
Processing gas: C$_4$F$_6$/Ar/O$_2$=15/750/35 sccm
Pressure: 3.33 Pa (25 mTorr)
High frequency power (higher frequency/lower frequency): 300 W/300 W
DC voltage: −150 V
(Reformation of the Photoresist Film)
Processing gas: H$_2$/Ar=100/800 sccm
Pressure: 6.65 Pa (50 mTorr)
High frequency power (higher frequency/lower frequency): 300 W/0 W
DC voltage: −900 V
(Trimming of the Photoresist Film)
Processing gas: O$_2$=1496 sccm
Pressure: 106.4 Pa (800 mTorr)
High frequency power (higher frequency/lower frequency): 2400 W/0 W
(Etching of the Silicon Nitride Film)
Processing gas: CH$_2$F$_2$/Ar/O$_2$=70/420/35 sccm
Pressure: 6.65 Pa (50 mTorr)
High frequency power (higher frequency/lower frequency): 400 W/400 W
DC voltage: −300 V After the above steps are performed repeatedly a plurality of times, the semiconductor wafer W was observed by an electron microscope. As a result, it was possible to confirm that a good step-shaped structure was formed.

Further, the trim ratio y/x in the trimming process was 7.0 nm/145.5 nm≈0.05. In a comparative example in which the reformation of the photoresist film was not performed before the trimming process, the trim ratio y/x was 558 nm/286.7 nm≈1.95. Therefore, it is confirmed that it is possible to significantly improve the trim ratio by performing the reformation of the photoresist film as in the present embodiment.

Further, when the value of the DC voltage in the reforming step of the photoresist film was set to −300 V in the above example, and a series of processing steps were performed under the same conditions as the above embodiment, the trim ratio y/x in the trimming step was 463 nm/259.3 nm≈1.79 mm. Also in this case, the trim ratio is more improved than when the reformation of the photoresist film was not performed, but the degree of improvement of the trim ratio was less than when the value of the DC voltage was set to −900 V. Therefore, the value of the DC voltage in the reforming step of the photoresist film is equal to or greater than, preferably, −300 V and, more preferably, −900 V. In manufacturing the step structure of multiple stages, the trim ratio is equal to or less than, preferably, 1.0, and more preferably, 0.7. Further, in the above embodiment, since the trim ratio is about 0.05 which is less than 0.1, it is possible to efficiently manufacture the step structure of multiple stages.

The pressure in the reforming step of the photoresist film may range from 1.33 Pa to 13.3 Pa (10 to 100 mTorr). As the pressure increases, the trim ratio is improved, but it has a trade-off relationship with the roughness of the sidewall of the photoresist film. Further, the high frequency power for plasma generation may range from 200 W to 500 W. As the power increases, the trim ratio is improved, but it has a trade-off relationship with the roughness of the sidewall of the photoresist film.

Figure 4A:
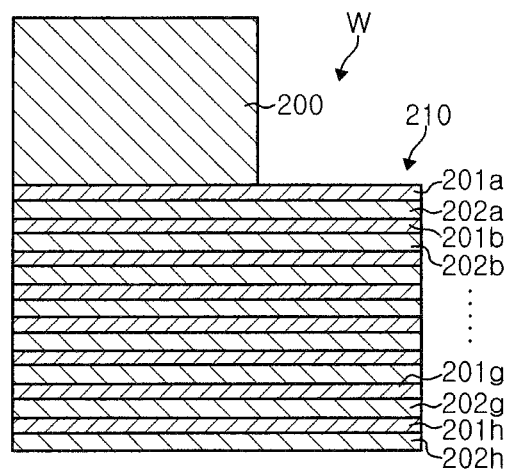
FIGS. 4A to 4F are cross sections showing schematic configuration of a semiconductor wafer according to another embodiment of the present invention.
Figure 4B:
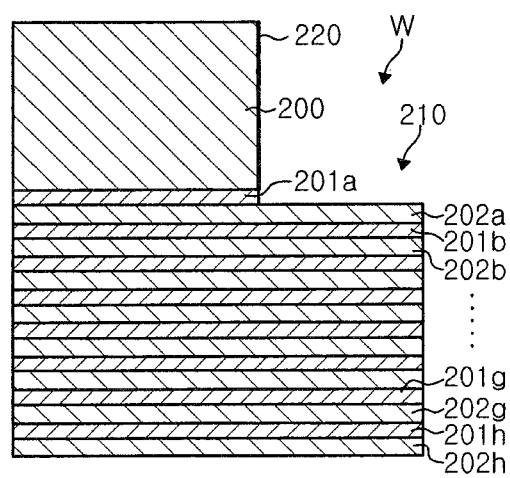
Figure 4C:
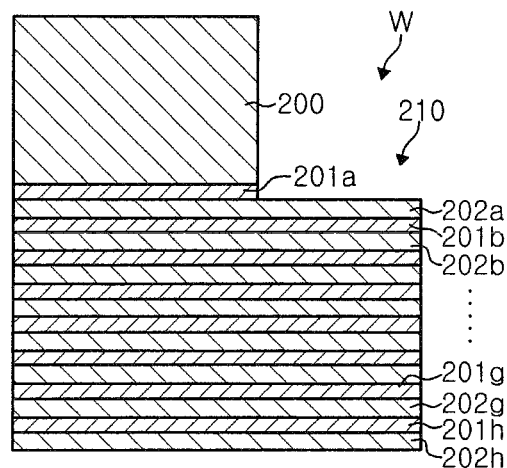

Next, the steps of a second embodiment will be described with reference to FIGS. 4A to 5. Further, parts corresponding to those of FIGS. 2A to 3 are denoted by corresponding reference numerals, and a redundant description thereof will be omitted. As shown in FIG. 4B, when an etching step (step 501 shown in FIG. 5) of the silicon dioxide film is performed, deposits 220 are deposited on the sidewall of the photoresist film 200. Thus, in the second embodiment, after the etching step (step 501 shown in FIG. 5) of the silicon dioxide film is performed, a deposit removing process for removing deposits generated by the plasma etching, especially, the deposits 220 deposited on the sidewall of the photoresist film 200 is performed, and the state shown in FIG. 4C is obtained (step 502 shown in FIG. 5).

The deposit removing process may be performed under the following conditions by using a plasma of the processing gas of, e.g., O$_2$+CF$_4$.

Figure 4D:
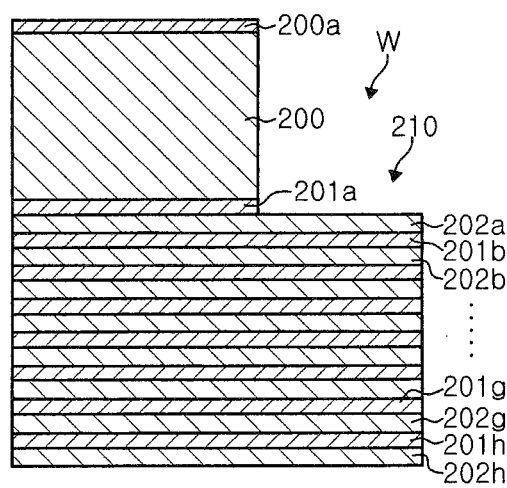
Figure 4E:
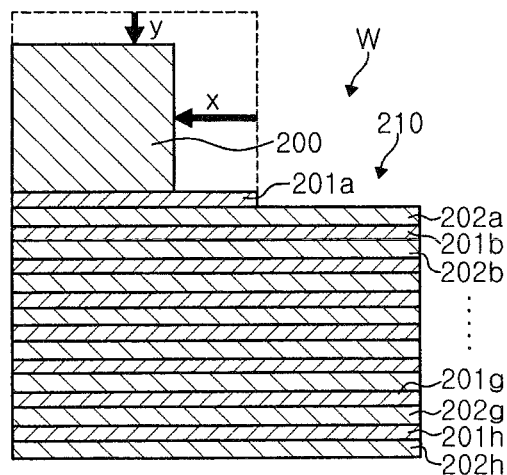

(Deposit Removing Process)
Processing gas: $O_2/CF_4$=150/350 sccm
Pressure: 26.6 Pa (200 mTorr)
High frequency power (higher frequency/lower frequency): 1500 W/0 W After performing the deposit removing process, in the same way as in the above-described embodiment, a reforming (curing) process for reforming the upper surface of the photoresist film 200 is performed to form a reformed film 200a on the upper surface of the photoresist film 200, and the state shown in FIG. 4D is obtained (step 503 shown in FIG. 5). The reforming (curing) process is performed by applying a negative DC voltage from the variable DC power supply 52 to the ceiling plate 16b made of silicon as the upper electrode while applying a high frequency power of a predetermined frequency from the first high frequency power supply 10a to the mounting table 2 as the lower electrode and supplying a mixed gas of Ar and $H_2$ as a processing gas to generate a plasma of the mixed gas in the plasma processing apparatus shown in FIG. 1.

Subsequently, a trimming process of the photoresist film 200 is performed to increase the opening area of the photoresist film 200. Specifically, a portion of the silicon dioxide film 201a below the photoresist film 200 is exposed to obtain the state shown in FIG. 4E (step 504 shown in FIG. 5). The trimming process is performed by using a plasma of the processing gas of, e.g., $O_2$.

Figure 4F:
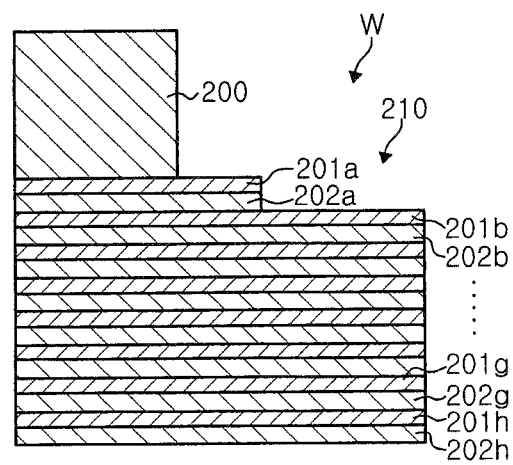

Then, using the photoresist film 200 and the exposed portion of the silicon dioxide film 201a as a mask, the silicon nitride film 202a below the silicon dioxide film 201a is plasma etched to obtain the state shown in FIG. 4F (step 505 shown in FIG. 5). The plasma etching process is performed by using a plasma of the processing gas of, e.g., $CH_2F_2+Ar+O_2$.

By the above-described steps, a step shape of the first stage is formed. Thereafter, the steps from the plasma etching of the silicon dioxide film 201 to the plasma etching of the silicon nitride film 202 are performed repeatedly a predetermined number of times (step 506 shown in FIG. 5) to form a step-shaped structure having a predetermined number of stages.

As in the above embodiment, the deposit removing process may be performed between the etching step of the silicon dioxide film and the reforming (curing) step of the photoresist film.

Further, in the embodiments and examples described above, a case where the multilayer film 210 includes the silicon dioxide ($SiO_2$) films 201a and the silicon nitride films 202a has been described. However, as described above, it may be applied to a multilayer film formed by stacking two types of films different in dielectric constant, for example, a silicon dioxide film and a doped polysilicon film, or by stacking a polysilicon film and a doped polysilicon film.

Further, the present invention is not limited to the embodiments and examples described above, and various modifications may be made. For example, the plasma processing apparatus is not limited to a parallel plate type plasma processing apparatus in which dual frequency powers are applied to the lower electrode as shown in FIG. 1, and may employ various kinds of plasma processing apparatuses such as a plasma processing apparatus in which high frequency powers are respectively applied to the upper and the lower electrode and a plasma processing apparatus in which a high frequency power is applied to the lower electrode.

INDUSTRIAL APPLICABILITY

The method for manufacturing a semiconductor device and the computer-readable storage medium according to the present invention are applicable in a field of manufacturing a semiconductor device or the like. Therefore, the present invention has industrial applicability.

DESCRIPTION OF REFERENCE SYMBOLS

200: photoresist film
201: silicon dioxide film
202: polysilicon film
210: multilayer film
W: semiconductor wafer

What is claimed is:
1. A semiconductor device manufacturing method for etching a substrate having a multilayer film formed by alternately stacking a first film having a first dielectric constant and a second film having a second dielectric constant different from the first dielectric constant, and further having a photoresist layer provided on the multilayer film and functioning as an etching mask to form a step-shaped structure, the method comprising:
   a first step of plasma-etching the first film by using the photoresist layer as a mask;
   a second step of removing deposits adhered to the photoresist layer from the plasma etching after the first step;
   a third step of exposing, after the second step, the photoresist layer formed on the substrate to a plasma by using a plasma processing apparatus which includes an upper electrode having at least a silicon member and further includes a lower electrode, which is disposed opposite to the upper electrode, for mounting thereon the substrate, the plasma being generated from a processing gas containing argon gas and hydrogen gas by applying a high frequency power to the lower electrode while applying a negative DC voltage to the upper electrode;
   a fourth step of trimming the photoresist layer after the third step; and
   a fifth step of plasma-etching the second film by using the photoresist layer trimmed in the fourth step and the first film plasma-etched in the first step as an etching mask,
   wherein the multilayer film is formed to have a step-shaped structure by repeatedly performing the first step to the fifth step.

2. The semiconductor device manufacturing method of claim 1, wherein in the third step, the negative DC voltage applied to the upper electrode is equal to or greater than −900 V.

3. The semiconductor device manufacturing method of claim 2, wherein the first film and the second film are respectively a silicon dioxide film and a doped polysilicon film, a silicon dioxide film and a silicon nitride film, or a polysilicon film and a doped polysilicon film.

4. The semiconductor device manufacturing method of claim 2, wherein the number of stacked films constituting the multilayer film is 64 or more in total.

5. The semiconductor device manufacturing method of claim 1, wherein the first film and the second film are respectively a silicon dioxide film and a doped polysilicon film, a silicon dioxide film and a silicon nitride film, or a polysilicon film and a doped polysilicon film.

6. The semiconductor device manufacturing method of claim 5, wherein the number of stacked films constituting the multilayer film is 64 or more in total.

7. The semiconductor device manufacturing method of claim 1, wherein the number of stacked films constituting the multilayer film is 64 or more in total.

8. A semiconductor device manufacturing method comprising:
- a plasma-etching step of plasma-etching a film below a photoresist layer formed on a substrate by using a photoresist layer as a mask;
- a deposit removing step of removing deposits adhered to the photoresist layer from the plasma-etching step;
- a photoresist reforming step of exposing, after removing the deposits, the photoresist layer to a plasma by using a plasma processing apparatus which includes an upper electrode having at least a silicon member and further includes a lower electrode, which is disposed opposite to the upper electrode, for mounting thereon the substrate, the plasma being generated from a processing gas containing argon gas and hydrogen gas by applying a high frequency power to the lower electrode while applying a negative DC voltage to the upper electrode; and
- a trimming step of trimming the photoresist layer after the photoresist reforming step,
- wherein in the trimming step, a ratio y/x of a trimming amount y in a height direction of the photoresist layer to a trimming amount x in a horizontal direction is equal to or less than 0.7.

* * * * *